(12) United States Patent
Lin (10) Patent No.: US 12,126,342 B1
(45) Date of Patent: Oct. 22, 2024

(54) LOW-OFFSET SUBSAMPLING PHASE DETECTOR AND METHOD THEREOF

(71) Applicant: Realtek Semiconductor Corp., Hsinchu (TW)

(72) Inventor: Chia-Liang (Leon) Lin, Fremont, CA (US)

(73) Assignee: REALTEK SEMICONDUCTOR CORP., Hsinchu (TW)

(*) Notice: Subject to any disclaimer, the term of this patent is extended or adjusted under 35 U.S.C. 154(b) by 38 days.

(21) Appl. No.: 18/333,581

(22) Filed: Jun. 13, 2023

(51) Int. Cl.
*H03K 3/023* (2006.01)
*H03K 5/01* (2006.01)
*H03K 5/00* (2006.01)

(52) U.S. Cl.
CPC ............... *H03K 3/023* (2013.01); *H03K 5/01* (2013.01); *H03K 2005/00058* (2013.01)

(58) Field of Classification Search
CPC . H03K 3/023; H03K 5/01; H03K 2005/00058
USPC ...................................................... 327/103
See application file for complete search history.

(56) References Cited

U.S. PATENT DOCUMENTS

| 8,816,774 B2* | 8/2014 | Shinichi | H03F 1/301 330/296 |
| 10,720,890 B1* | 7/2020 | Lin | H03F 3/04 |
| 2024/0162863 A1* | 5/2024 | Lin | H03F 3/45475 |
| 2024/0171142 A1* | 5/2024 | Kord | H03F 1/223 |

* cited by examiner

*Primary Examiner* — Ryan Jager
(74) *Attorney, Agent, or Firm* — McClure, Qualey & Rodack, LLP (57) ABSTRACT

A method of phase detection includes receiving a reference clock and an input clock having a first input signal and a second input; sampling the first input signal and the second input signal into a first sample and a second sample; converting the first sample and the second sample into a first current and a second current; using a regulated current mirror to convert the first current into the third current; using a first current steering network to steer the second current into either a fourth current or a fifth current in accordance with a pulse signal; using a second current steering network to steer the third current into either a sixth current or a seventh current; connecting a lowpass filter to the output node to establish an output voltage and a lowpass-filtered voltage; and forcing the standby voltage to be equal to the lowpass-filtered voltage using a unity-gain buffer.

20 Claims, 4 Drawing Sheets

LOW-OFFSET SUBSAMPLING PHASE DETECTOR AND METHOD THEREOF

BACKGROUND OF THE INVENTION

Field of the Invention

The present invention generally relates to phase detector and particularly related to subsampling phase detectors, and related methods, having low offset.

Description of Related Art

Persons of ordinary skill in the art understand terms and basic concepts related to microelectronics that are used in the context of this disclosure, such as "voltage," "current," "signal," "differential," "logical signal," "switch," "clock," "phase," "frequency," "capacitor," "lowpass filter," "resistor," "transistor," "MOST (metal-oxide semiconductor transistor)," "PMOST (p-channel metal oxide semiconductor transistor)," "NMOST (n-channel metal oxide semiconductor transistor)," "AC (alternating current)," "DC (direct current)," "DC coupled," "AC coupled," "source," "gate," "drain," "node," "ground node," "power supply node," "current mirror," "current source," "current sink," "operational amplifier," and "common-source amplifier." Terms and basic concepts like these in the context of this present disclosure are apparent to those of ordinary skill in the art and thus will not be explained in detail.

Those of ordinary skill in the art can recognize a resistor symbol, a capacitor symbol, an inductor symbol, and a MOST (metal-oxide semiconductor transistor) symbol, for both PMOST (p-channel metal-oxide semiconductor transistor) and NMOST (n-channel metal-oxide semiconductor transistor), and can identify a "source" terminal, a "gate" terminal, and a "drain" terminal of a MOST. For brevity, in this present disclosure, in a context of referring to a MOST, a "source terminal" is simply referred to as "source," a "gate terminal" is simply referred to as "gate," and a "drain terminal" is simply referred to as "drain."

Those of ordinary skills in the art can read schematics of a circuit comprising resistors, capacitors, inductors, NMOST, and PMOST, and do not need a verbose description about how one transistor, resistor, inductor, or capacitor connects with another in the schematics.

A DC (direct current) node is a circuit node of a substantially stationary electrical potential. Throughout this disclosure, "$V_{SS}$" denotes a ground node, while "$V_{DD}$" denotes a power supply node. Both "$V_{SS}$" and "$V_{DD}$" are DC nodes.

A signal is a voltage of a variable level that carries a certain information and can vary with time. A level of the signal at a moment represents a state of the signal at that moment.

A logical signal is a voltage signal of two states: a low state and a high state; the logical signal is in the high state when its voltage level is above a trip point and in the low state otherwise. The low state is also referred to as a "0" state, while the high stage is also referred to as a "1" state. Regarding a logical signal Q, "Q is high" or "Q is low," means "Q is in the high state" or "Q is in the low state." Likewise, "Q is 1" or "Q is 0," means "Q is in the 1 state" or "Q is in the 0 state."

A first logical signal may not necessarily have the same trip point as a second logical signal.

A first logical signal is said to be a logical inversion of a second logical signal, if the first logical signal and the second logical signal are always in opposite states. That is, when the first logical signal is low (high), the second logical signal is high (low). When a first logical signal is a logical inversion of a second logical signal, the first logical signal and the second logical signal are said to be complementary to each other.

A logical signal can be used to control a function to either enable or disable the function. When the logical signal is in a state that enables the function, the logical signal is said to be "asserted"; otherwise, the logical signal is said to be "de-asserted."

A switch is a device of two possible states, "on" and "off." A switch is approximately a short circuit when it is in the "on" state and approximately an open circuit when it is in the "off" state. A switch can be embodied using either a NMOS transistor or a PMOS transistor. When a MOS transistor, either a NMOS transistor or a PMOS transistor, is used to embody a switch, it is controlled by a control signal that is a logical signal applied at a gate of the MOS transistor. A switch embodied by a NMOS transistor is in an "on" state when the control signal is high, and in an "off" state when the control signal is low. A switch embodied by a PMOS transistor is in an "on" state when the control signal is low, and in an "off" state when the control signal is high. In any case, a switch is in an "on" ("off") state when its control signal is asserted (de-asserted).

A clock is a logical signal that cyclically toggles back and forth between a low state and a high state. A phase of a clock refers to a timing of the clock where either a low-to-high or a high-to-low state transition occurs.

A phase detector receives a reference clock and an input clock, detects a phase difference between the reference clock and the input clock, and outputs a charge to a subsequent circuit in accordance with the phase difference. Ideally, the charge is proportional to the phase difference, and should be zero when the phase difference is zero. In reality, however, due to an impairment in an actual implementation, the charge is often nonzero when the phase difference is zero, and instead the charge is zero when the phase difference is equal to a nonzero value that is referred to as an offset of the phase detector.

A subsampling phase detector is a type of phase detector wherein a frequency of an input clock is an integer multiple of a frequency of a reference clock, and a phase difference between the reference clock and the input clock is detected by sampling the input clock using the reference clock. A prior art subsampling phase detector comprises: a sampling circuit configured to generate a voltage sample of the input clock using the reference clock; a charge pump working in a pulsed manner and configured to convert the voltage sample into a net charge; and a load configured to receive the charge and establish an output voltage accordingly. In a differential signal embodiment, the input clock comprises a first voltage $V_{i+}$ and a second voltage $V_{i-}$ that can be mathematically modeled by the following two equations:

$$V_{i+} = V_{i0} + A_i \sin(2\pi f_i t + \theta) \qquad (1)$$

$$V_{i-} = V_{i0} - A_i \sin(2\pi f_i t + \theta) \qquad (2)$$

Here, $V_{i0}$, $A_i$, $f_i$, and $\theta$ denote a DC (direct current) level, an AC (alternating current) amplitude, a frequency, and a phase of the input clock, while t denotes a time variable.

The reference clock is a voltage $V_r$ that can be mathematically modeled by the following equation:

$$V_r = V_{r0} + A_r \operatorname{sign}[\sin(2\pi f_r t)] \qquad (3)$$

Here, $V_{r0}$, $A_r$, $f_r$, and $\theta$ denote a DC (direct current) level, an AC (alternating current) amplitude, a frequency, and a phase of the reference clock, while t denotes a time variable, and sign[·] denotes a sign function that is 1 if its argument is positive or zero and −1 if its argument is negative. Also, $f_r$ is related to $f_i$ by the following equation:

$$f_i = N \cdot f_r \quad (4)$$

Here, N is a clock multiplication factor, which is an integer greater than 1.

Sampling of $V_{i+}$ and $V_{i-}$ takes place upon an edge, e.g., rising edge, of the reference clock, i.e., which occurs when t is equal to 0, $1/f_r$, $2/f_r$, $3/f_r$, and so on, and two voltage samples $V_{s+}$ and $V_{s-}$ are obtained by the sampling, where $$V_{s+} = V_{i0} + A_i \sin(\theta) \quad (5)$$

$$V_{s-} = V_{i0} - A_i \sin(\theta) \quad (6)$$

The subsampling phase detector is usually used in a phase lock loop wherein in a steady state $\theta$ is very small and (5) and (6) can be rewritten as follows:

$$V_{s+} \approx V_{i0} + A_i \theta \quad (7)$$

$$V_{s-} \approx V_{i0} - A_i \theta \quad (8)$$

The charge pump comprises a current source configured to output a first current $I_{p0}$ to the load in accordance with $V_{s+} - V_{s-}$ and a current sink configured to output a second current $I_n$ to the load in accordance with $V_{s+} - V_{s-}$, wherein $$I_p = I_{p0} + G_p(V_{s+} - V_{s-}) \approx I_{p0} + 2G_p A_i \theta \quad (9)$$

$$I_n = -I_{n0} - G_n(V_{s+} - V_{s-}) \approx -I_{n0} - 2G_n A_i \theta \quad (10)$$

Here, $G_p$ is a voltage-to-current conversion ratio of the current source, $I_{p0}$ is a constant current supplied by the current source, $G_n$ is a voltage-to-current conversion ratio of the current sink, and $I_{n0}$ is a constant current sunk by the current sink. Note that a current sink outputs a negative current because it draws a current from the output, and therefore a value of the second current $I_n$ is of a negative sign. The charge pump works in a pulsed manner and is turned on for a time interval of $\tau$; a net charge $Q_{net}$ received by the load is:

$$Q_{net} = (I_p + I_n)\tau \approx (I_{p0} - I_{n0})\tau + 2(G_p - G_n)A_i \theta \tau$$

If $I_{p0}$ is equal to $I_{n0}$, the net charge $Q_{net}$ will be zero when 0 (i.e., the phase difference between the input clock and the reference clock) is zero. In practice, however, the current source and the current sink must be embodied by different devices; in an embodiment using a CMOS (complementary metal oxide semiconductor) process technology, for instance, a current source is embodied by a PMOST, while a current sink is embodied by a NMOST, and usually $I_{p0}$ will not be equal to $I_{n0}$ due to a mismatch between a NMOST and a PMOST that is often referred to as a "P-N mismatch"; in this case, the net charge $Q_{net}$ will not be zero even though the phase difference is zero. The P-N mismatch thus results in an offset of the subsampling phase detector.

A subsampling phase detector is usually incorporated in a phase clock loop configured to control the input clock so that a phase of the input clock is aligned with a phase of the reference clock. An offset of the subsampling phase detector is undesirable, as it will force the phase lock loop to settle to a state wherein the phase difference between the input clock and the phase clock is not zero, but the offset; this causes a usable detection range of the subsampling phase detector to be reduced by an amount equal to the offset. This issue is particularly troublesome to an application where the frequency of the input clock is high (e.g., 8 GHz) and even a seemingly small offset (e.g., 20 ps) can be appreciable compared to a period of the input clock (e.g., 125 ps).

What is desired is a subsampling phase detector that can have a low offset.

BRIEF SUMMARY OF THIS INVENTION

An objective of this invention is to reduce an offset of a subsampling phase detector.

Another objective of this invention is to allow a subsampling phase detector to have a small offset and maintain substantially the same DC (direct current) condition despite generating an output in a pulsed manner.

A yet another objective of this invention is to allow a subsampling phase detector to have an adjustment gain.

In an embodiment, a subsampling phase detector comprises: a pulse generator configured to receive a reference clock and generate a pulse signal synchronized with the reference clock; a sampling network configured to sample an input clock comprising a first input voltage and a second input voltage into a first sample and a second sample stored on a first capacitor and a second capacitor, respectively, in accordance with the reference clock; a V2I (voltage-to-current converter) configured to convert the first sample and the second sample into a first current and a second current in accordance with a bias voltage; a regulated current mirror configured to mirror the first current into a third current controlled in a closed-loop manner in accordance with a standby voltage at a standby node; a first current steering network configured to steer the second current into either a fourth current directed to a standby node or a fifth current directed to an output node in accordance with the pulse signal; a second current steering network configured to steer the third current into either a sixth current directed to the standby node or a seventh current directed to the output node in accordance with the pulse signal; a load connected to the output node, comprising a lowpass filter, and configured to establish an output voltage at the output node in response to a sum of the fifth current and the seventh current, wherein a lowpass-filtered voltage is an output of the lowpass filter; and a unity-gain buffer configured to receive the lowpass-filtered voltage and establish the standby voltage.

In an embodiment, a method of phase detection comprises: receiving a reference clock and an input clock comprising a first input signal and a second input; sampling the first input signal and the second input signal into a first sample and a second sample stored on a first capacitor and a second capacitor, respectively, in accordance with the reference clock; converting the first sample and the second sample into a first current and a second current using a voltage-to-current converter; using a regulated current mirror configured to convert the first current into the third current in a closed-loop manner in accordance with a standby voltage at a standby node; using a first current steering network to steer the second current into either a fourth current directed to the standby node or a fifth current directed to an output node in accordance with a pulse signal that is synchronized with the reference clock; using a second current steering network to steer the third current into either a sixth current directed to the standby node or a seventh current directed to the output node in accordance with the pulse signal; connecting a lowpass filter to the output node to establish an output voltage and a lowpass-filtered voltage; and forcing the standby voltage to be equal to the lowpass-filtered voltage using a unity-gain buffer.

DETAILED DESCRIPTION OF THIS INVENTION

The present invention relates to subsampling phase detector. While the specification describes several example embodiments of the invention considered favorable modes of practicing the invention, it should be understood that the invention can be implemented in many ways and is not limited to the particular examples described below or to the particular manner in which any features of such examples are implemented. In other instances, well-known details are not shown or described to avoid obscuring aspects of the invention.

Throughout this disclosure, "DC" stands for direct current, and "AC" stands for alternating current. A DC voltage refers to a substantially-stationary voltage. An AC voltage refers to a voltage that varies with time in an oscillatory manner and is also referred to as a dynamic voltage. In general, a signal comprises a DC component and an AC component; the former is substantially-stationary and remain fixed in a time duration of interest; and the latter is dynamic and can vary with time in a time duration of interest.

A DC node is a node of a substantially-stationary voltage. Throughout this disclosure, "$V_{DD}$" denotes a first DC node referred to as a power node, and "$V_{SS}$" denotes a second DC node referred to as a ground node.

A circuit is a collection of a transistor, a capacitor, an inductor, a resistor, and/or other electronic devices interconnected in a certain manner to embody a certain function. A network is a circuit or a collection of circuits configured to embody a certain function.

In this present disclosure, a "circuit node" may be simply referred to as a "node" for short, as the meaning is clear from a context of microelectronics won't cause confusion.

Figure 1:
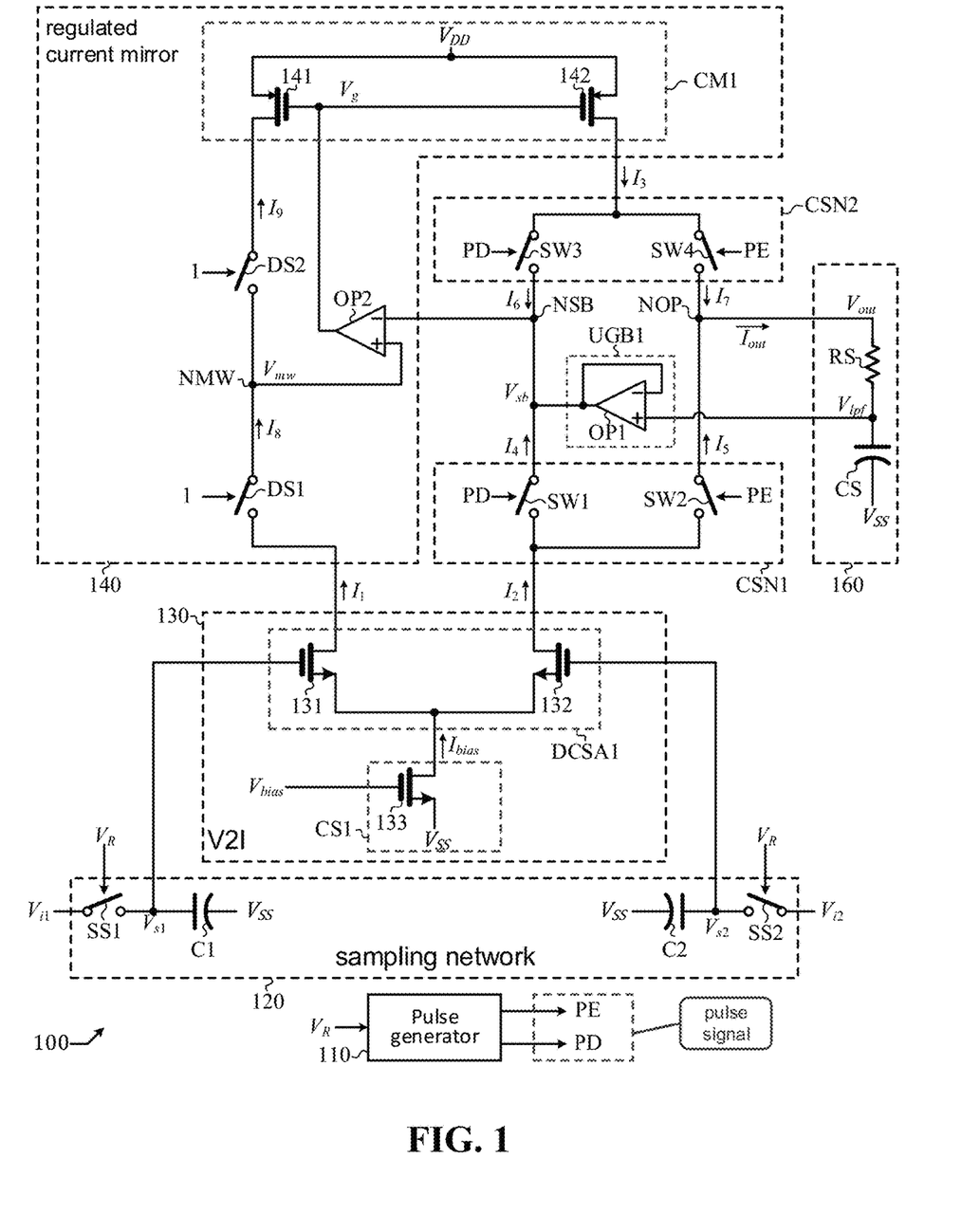
FIG. 1 shows a schematic diagram of a subsampling phase detector in accordance with an embodiment of the present invention.

As shown by a schematic diagram depicted in FIG. 1, a subsampling phase detector 100 in accordance with an embodiment of the present disclosure comprises: a pulse generator 110 configured to receive a reference clock $V_R$ and output a pulse signal including a first logical signal PD (which stands for pulse-disable) and a second logical signal PE (which stands for pulse-enable) that is an inversion of the first logical signal PD; a sampling network 120 configured to sample a first input signal Vii and a second input signal $V_{i2}$ into a first sample $V_{s1}$ and a second sample $V_{s2}$, respectively, in accordance with the reference clock $V_R$, wherein the first input signal Vii and the second input signal $V_{i2}$ jointly embody an input clock in a differential signal embodiment; a V2I (voltage-to-current converter) 130 configured to convert the first sample $V_{s1}$ and the second sample $V_{s2}$ into a first current $I_1$ and a second current $I_2$ in accordance with a bias voltage Vbias; a regulated current mirror 140 configured to mirror the first current $I_1$ into a third current $I_3$ in a closed-loop manner in accordance with a standby voltage $V_{sb}$ at a standby node NSB; a first current steering network CSN1 configured to steer the second current $I_2$ into either a fourth current $I_4$ directed to the standby node NSB or a fifth current Is directed to an output node NOP in accordance with the pulse signal (PE and PD); a second current steering network CSN2 configured to steer the third current $I_3$ into either a sixth current $I_6$ directed to the standby node NSB or a seventh current $I_7$ directed to the output node NOP in accordance with the pulse signal (PE and PD); a load 160 connected to the output node NOP, comprising a lowpass filter, and configured to receive an output current $I_{out}$, which is a sum of the fifth current Is and the seventh current $I_7$, from the output node NOP, and establish accordingly an output voltage $V_{out}$ and a lowpass-filtered voltage $V_{lpf}$; and a unity-gain buffer UGB1 configured to receive the lowpass-filtered voltage $V_{lpf}$ and output the standby voltage $V_{sb}$ at the standby node NSB.

In terms of functions: the sampling network 120 embodies a phase detector that generates $V_{s1}$ and $V_{s2}$ to represent a phase difference between the input clock (embodied by Vii and $V_{i2}$) and the reference clock $V_R$, wherein a larger difference between $V_{s1}$ and $V_{s2}$ indicates a greater phase difference between the reference clock $V_R$ and the input clock; the V2I 130, the regulated current mirror 140, and the two current-steering networks CSN1 and CSN2 jointly embody a charge pump that converts $V_{s1}$ and $V_{s2}$ into $I_{out}$ in accordance with the pulse signal (PE and PD) that is generated by the pulse generator 110 in a pulsed manner synchronized with the reference clock $V_R$; and the unity-gain buffer UGB1 is used to ensure the charge pump can maintain a stable DC (direct current) condition so that the DC levels at the standby node NSB and the output node NOP are the same despite that the charge pump works in a pulsed manner.

The sampling network 120 comprises: a first sampling switch SS1 configured to sample $V_{i1}$ into $V_{s1}$ stored on a first capacitor C1 in accordance with $V_R$; and a second sampling switch SS2 configured to sample $V_{i2}$ into $V_{s2}$ stored on a second capacitor C2 in accordance with $V_R$.

Figure 2A:
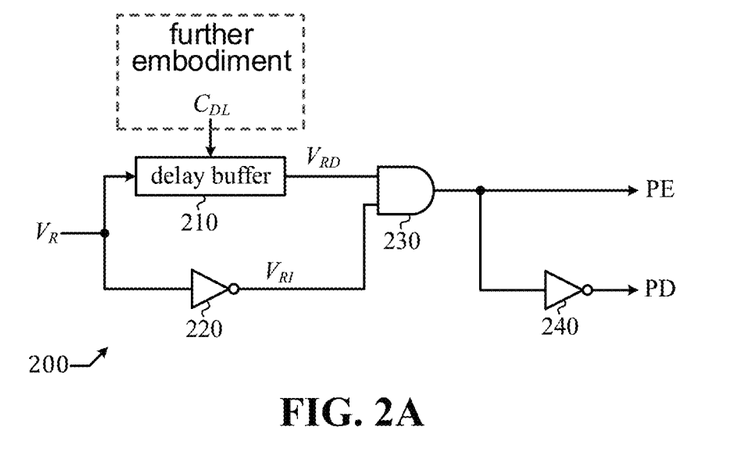
FIG. 2A shows a schematic diagram of pulse generator that can be used in the subsampling phase detector of FIG. 1.
Figure 2B:
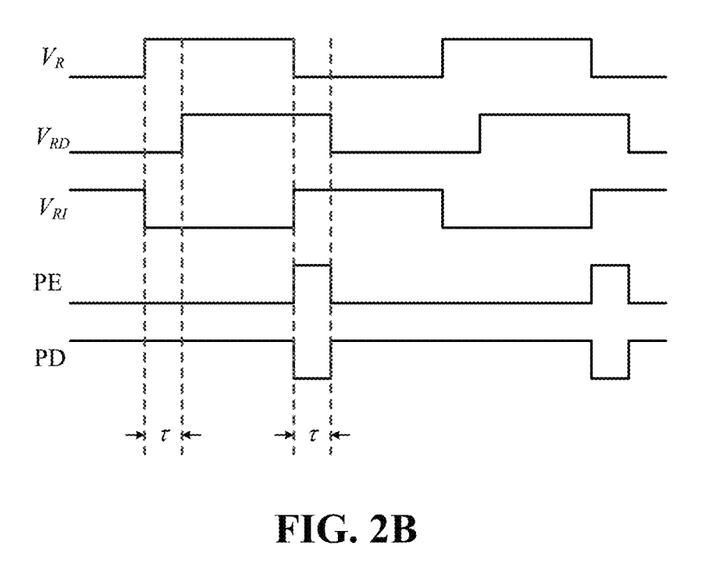
FIG. 2B shows an exemplary timing diagram of the pulse generator of FIG. 2A.
Figure 2C:
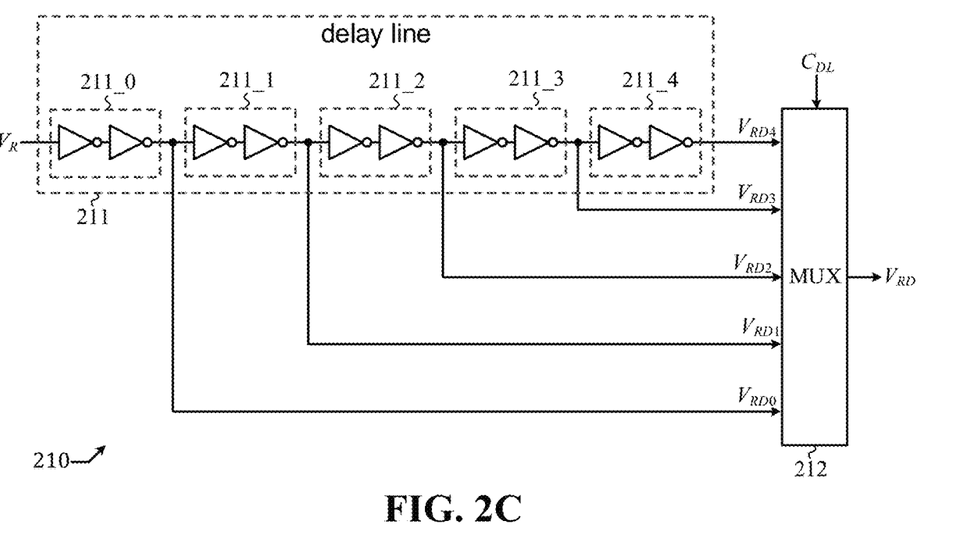
FIG. 2C shows a schematic diagram of a delay buffer of programmable delay that can be used in the pulse generator of FIG. 2A.

A schematic diagram of a pulse generator 200 that can be used to embody the pulse generator 110 is depicted in FIG. 2A. The pulse generator 200 comprises: a delay buffer 210 configured to receive the reference clock $V_R$ and output a delayed clock $V_R D$; a first inverter 220 configured to receive the reference clock $V_R$ and output an inverted clock $V_{RI}$; an AND gate 230 configured to receive the delayed clock $V_R D$ and the inverted clock $V_{RI}$ and output the second logical signal PE; and a second inverter 240 configured to receive the second logical signal PE and output the first logical signal PD, which is a logical inversion of PE. An exemplary timing diagram of the pulse generator 200 is shown in FIG. 2B. As shown, $V_R D$ is a delayed version of $V_R$ with a delay of τ; $V_{RI}$ is a logical inversion of $V_R$; PE is a result of an AND operation of $V_R D$ and $V_{RI}$; and PD is a logical inversion of PE. AND gates and inverters are well understood by those of ordinary skills in the art and thus not described in detail. The delay τ determines a duration of which PE is asserted, and consequently a duration of which the output current $I_{out}$ is enabled. Delay buffer 210 can be implemented using a delay line of inverters comprising a cascade of even stages of inverters, wherein a number of cascaded stages determines a delay: the more cascaded stages, the greater delay. In a further embodiment, a delay of the delay buffer 210 is programmable and controlled by a control code $C_{DL}$. By way of example but not limitation, an embodiment of delay buffer 210 of programmable delay is shown in FIG. 2C. As shown, the delay buffer 210 comprises a delay line 211 comprising a cascade of five two-stage inverter buffers 211_0, 211_1, 211_2, 211_3, and 211_4 configured to receive $V_R$ and output five delayed clocks $V_{RD0}$, $V_{RD1}$, $V_{RD2}$, $V_{RD3}$, and $V_{RD4}$, respectively, and a multiplexer (MUX) 212 configured to output $V_{RD}$ by selecting one of $V_{RD0}$, $V_{RD1}$, $V_{RD2}$, $V_{RD3}$, and $V_{RD4}$ in accordance with the control code $C_{DL}$, which is an integer no less than 0 and no greater than 4. When $C_{DL}$ is 0 (1, 2, 3, 4), $V_{RD0}$ ($V_{RD1}$, $V_{RD2}$, $V_{RD3}$, and $V_{RD4}$) is selected as $V_{RD}$. Inverter, multiplexer, and a principle of the delay buffer 210 are all well understood by those of ordinary skill in the art and thus not described in detail. When the delay of the delay buffer 210 is programmable, a pulse width of the pulse signal (PE and PD) is programmable, a duration of which the output current $I_{out}$ is enabled is programmable, and consequently a gain of the subsampling phase detector 100 will be programmable if the delay buffer 210 of FIG. 2C is used in the pulse generator 110.

The V2I 130 comprises a differential common-source amplifier DCSA1 comprising a first NMOST 131 and a second NMOST 132 configured to receive $V_{s1}$ and $V_{s2}$ and output $I_1$ and $I_2$, respectively, in accordance with a bias current $I_{bias}$ provided by a current sink CS1 embodied by a third NMOST 133 controlled by $V_{bias}$. Note that, although $I_{bias}$ is shown to be seemingly flowing from CS1 to DCSA1 in FIG. 1, the direction of $I_{bias}$ is shown in a logical sense in a way that serves a functional description purpose to indicate that CS1 initiates and dominates the generation of $I_{bias}$ while DCSA1 receives $I_{bias}$ and reacts accordingly. The actual direction of physical current flow is opposite, i.e., the bias current $I_{bias}$ flows from DCSA1 to CS1, because CS1 is a current sink that will sink current in. In other words, $I_{bias}$ is of a negative value. The same thing can be said about $I_1$ and $I_2$.

The first current steering network CSN1 comprises: a first switch SW1 controlled by PD and configured to steer $I_2$ into $I_4$ directed to the standby node NSB when PD is asserted and a second switch SW2 controlled by PE and configured to steer $I_2$ into Is directed to the output node NOP when PE is asserted. The second current steering network CSN2 comprises a third switch SW3 controlled by PD and configured to steer $I_3$ into $I_6$ directed to the standby node NSB when PD is asserted, and a fourth switch SW4 controlled by PE and configured to steer $I_3$ into $I_7$ directed to the output node NOP when PE is asserted.

The load 160 is connected to the output node NOP and comprises a serial connection of a serial resistor RS and a load capacitor CS, which form a low-pass filter. The low-pass-filtered voltage $V_{lpf}$ is stored on the load capacitor CS, is an output of lowpass filtering from $V_{out}$, and has the same DC value as $V_{out}$. A concept of lowpass filter and that the serial resistor RS and the load CS form a lowpass filter are well understood by those of ordinary skill in the art and thus not explained in detail.

The unity-gain buffer UGB1 comprises a first operational amplifier OP1 configured in a unity-gain configuration, wherein a positive input terminal "+" connects to $V_{lpf}$ and a negative input terminal "−" connects to $V_{sb}$, which is an output of OP1. Due to the unity-gain buffer UGB1, $V_{sb}$ and $V_{out}$ have the same DC values (because $V_{out}$ and $V_{lpf}$ have the same DC value and UGB1 forces $V_{sb}$ to be equal to $V_{lpf}$), regardless of a state of the pulse signal (PD and PE) and a switching activity of the first current steering network CSN1 and the second current steering network CSN2.

Regulated current mirror 140 comprises: a first dummy switch DS1 configured to conduct the first current $I_1$ into an eighth current $I_8$ directed to a midway node NMW; a second dummy switch DS2 configured to conduct the eighth current $I_8$ into a ninth current $I_9$; a current mirror CM1 comprising a first PMOST 141 and a second PMOST 142 configured to mirror the ninth current $I_9$ into the third current $I_3$; and a second operational amplifier OP2 configured to output a gate voltage $V_g$ to control the current mirror CM1 in accordance with a voltage difference between a midway voltage $V_{mw}$ at the midway node NMW and the standby voltage $V_{sb}$ at the standby node NSB. The first dummy switch DS1 is used to mimic SW1 and SW2. Note that between SW1 and SW2, at a given moment, one of them is turned on and the other is turned off, depending on a state of the pulse signal (PE and PD). On the other hand, DS1 is always turned on (as illustrated by being controlled by a logical "1" in FIG. 1). Likewise, the second dummy switch DS2 is used to mimic SW3 and SW4 and is always turned on. The second operational amplifier OP2 and the first PMOST 141 form a negative feedback loop to adjust the gate voltage $V_g$ in a closed-loop manner to force $V_{mw}$ to be equal to $V_{sb}$. Therefore, the midway voltage $V_{mw}$ at the midway node NMW, the standby voltage $V_{sb}$ at the standby node NSB, and the output voltage $V_{out}$ at the output node NOP all have the same DC level. This way, at a given moment, the first current $I_1$ and the second current $I_2$ have the same condition of conduction, as far as a DC condition is concerned. Likewise, the ninth current $I_9$ and the third current $I_3$ have the same condition of conduction. In the current mirror CM1, the first PMOST 141 and the second PMOST 142 are identical. Since PMOST 141 and PMOST 142 have the same source voltage ("$V_{DD}$"), the same gate voltage ($V_g$), and the same drain voltage ($V_{mw}$ plus a voltage drop of DS2, $V_{sb}$ plus a voltage drop of SW3 or $V_{out}$ plus a voltage drop of SW4), they must have the same drain current. This way, the current mirror CM1 is said to be regulated, and the third current $I_3$ is equal to the ninth current $I_9$ (in magnitude). Since $I_9$ is equal to $I_1$, $I_3$ is equal to $I_1$ (in magnitude).

When the reference clock $V_R$ is aligned with the input clock (embodied by $V_{i1}$ and $V_{i2}$), $V_{s1}$ is equal to $V_{s2}$ and consequently $I_1$ is equal to $I_2$ and $I_3$ is equal to $I_2$ in magnitude, the output current $I_{out}$ will be zero, because $I_2$ and $I_3$ are of the same magnitude yet opposite in sign. This way, the subsampling phase detector 100 has substantially zero offset.

Note that the two dummy switches DS1 and DS2 are used to make the two PMOST 141 and 142 have the same DC conditions at their drains and thus improve the accuracy of current mirroring of the current mirror CM1. The dummy switches DS1 and DS2 are useful, but not absolutely necessary. A circuit designer may choose to remove DS1 and DS2 and replace each of them by a short circuit; in doing so, the complexity of the subsampling phase detector 100 is reduced at a cost of less accurate current mirroring of the current mirror CM1 (due to without having DS2 to mimic a voltage drop of SW3 and SW4 and without DS1 to mimic a voltage drop of SW1 and SW2) and consequently a larger offset of phase detection, but the function of the subsampling phase detector 100 can still be preserved.

For any given circuit comprising NMOST and/or PMOST, a function of said circuit remains the same if every NMOST is replaced with a PMOST, every PMOST is replaced with a NMOST, every power supply node is replaced with a ground node, and every ground node is replaced with a power supply node; in other words, NMOST and PMOST are swapped, and power supply node and ground node are also swapped. Therefore, in the appended claims, NMOST and PMOST are not explicitly stated; instead, "MOST of a first type" and "MOST of a second type" are stated; in one embodiment, "MOST of a first type" and "MOST of a second type" refer to NMOST and PMOST, respectively; in another embodiment, "MOST of a first type" and "MOST of a second type" refer to PMOST and NMOST, respectively. Likewise, power supply node and ground node are not explicitly stated; instead, "a first DC node" and "a second DC node" are used.

Figure 3:
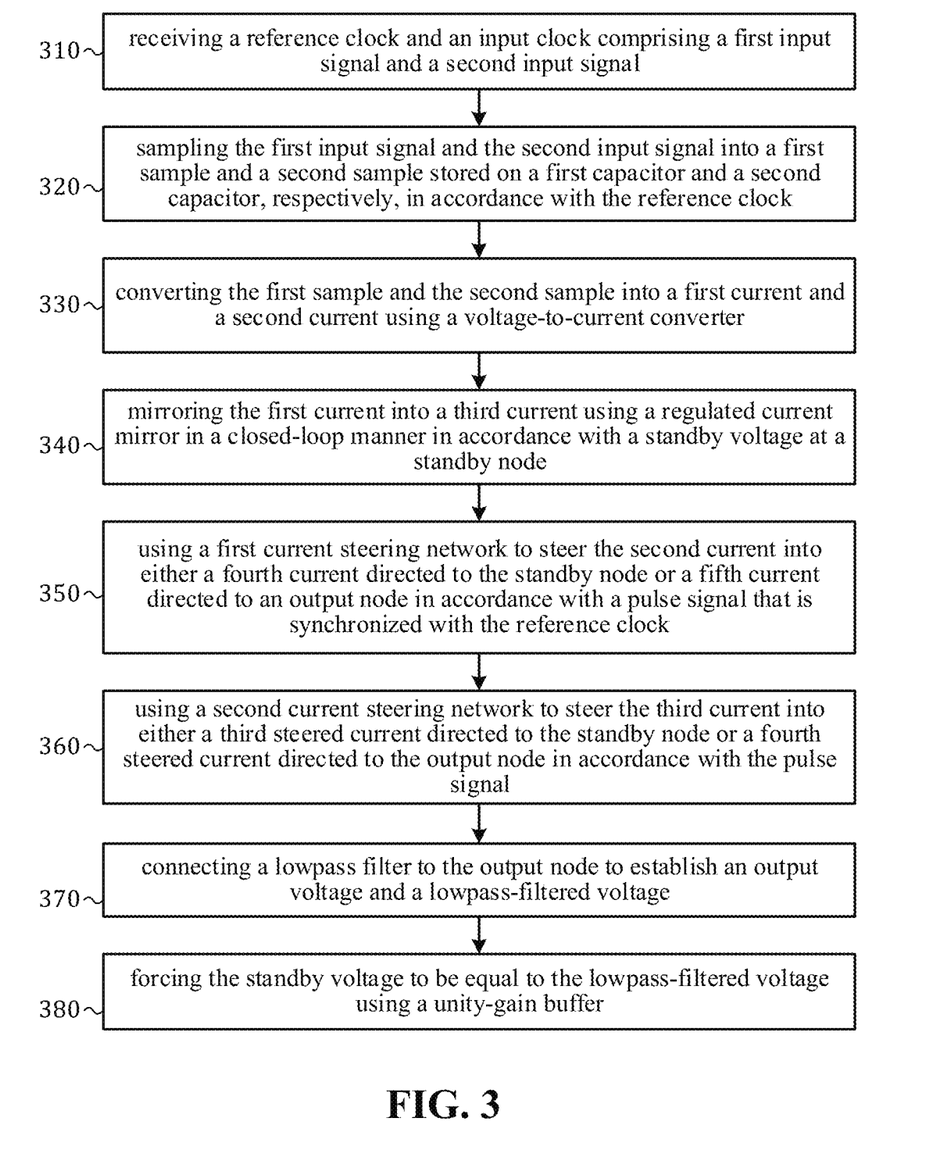
FIG. 3 shows a flow diagram of a method of subsampling phase detection in accordance with the present invention.

As illustrated by a flow diagram depicted in FIG. 3, a method of phase detection comprises the following steps: (step 310) receiving a reference clock and an input clock comprising a first input signal and a second input signal; (step 320) sampling the first input signal and the second input signal into a first sample and a second sample stored on a first capacitor and a second capacitor, respectively, in accordance with the reference clock; (step 330) converting the first sample and the second sample into a first current and a second current using a voltage-to-current converter; (step 340) mirroring the first current into a third current using a regulated current mirror in a closed-loop manner in accordance with a standby voltage at a standby node; (step 350) using a first current steering network to steer the second current into either a fourth current directed to the standby node or a fifth current directed to an output node in accordance with a pulse signal that is synchronized with the reference clock; (step 360) using a second current steering network to steer the third current into either a sixth current directed to the standby node or a seventh current directed to the output node in accordance with the pulse signal; (step 370) connecting a lowpass filter to the output node to establish an output voltage and a lowpass-filtered voltage; and (step 380) forcing the standby voltage to be equal to the lowpass-filtered voltage using a unity-gain buffer.

Those skilled in the art will readily observe that numerous modifications and alterations of the device and method may be made while retaining the teachings of the disclosure. Accordingly, the above disclosure should not be construed as limited only by the metes and bounds of the appended claims.

What is claimed is:

1. A subsampling phase detector comprising:
    a pulse generator configured to receive a reference clock and generate a pulse signal synchronized with the reference clock;
    a sampling network configured to sample an input clock comprising a first input voltage and a second input voltage into a first sample and a second sample stored on a first capacitor and a second capacitor, respectively, in accordance with the reference clock;
    a V2I (voltage-to-current converter) configured to convert the first sample and the second sample into a first current and a second current in accordance with a bias voltage;
    a regulated current mirror configured to mirror the first current into a third current controlled in a closed-loop manner in accordance with a standby voltage at a standby node;
    a first current steering network configured to steer the second current into either a fourth current directed to a standby node or a fifth current directed to an output node in accordance with the pulse signal;
    a second current steering network configured to steer the third current into either a sixth current directed to the standby node or a seventh current directed to the output node in accordance with the pulse signal;
    a load that is connected to the output node, comprising a lowpass filter, and configured to establish an output voltage at the output node in response to a sum of the fifth current and the seventh current, wherein a lowpass-filtered voltage is an output of the lowpass filter; and
    a unity-gain buffer configured to receive the lowpass-filtered voltage and establish the standby voltage.

2. The subsampling phase detector of claim 1, wherein the pulse signal comprises a first logical signal and a second logical signal that is an inversion of the first logical signal.

3. The subsampling phase detector of claim 2, wherein: the first current steering network comprises a first switch controlled by the first logical signal and configured to steer the second current into the fourth current and a second switch controlled by the second logical signal and configured to steer the second current into the fifth current; and the second current steering network comprises a third switch controlled by the first logical signal and configured to steer the third current into the sixth current and a fourth switch controlled by the second logical signal and configured to steer the third current into the seventh current.

4. The subsampling phase detector of claim 2, wherein the pulse generator comprises a delay line of a delay approximately equal to a pulse width of the pulse signal and configured to receive the reference clock and output a third logical signal, an inverter configured to receive the reference clock and output a fourth logical signal, and an AND gate configured to receive the third logical signal and the fourth logical signal and output the second logical signal.

5. The subsampling phase detector of claim 4, wherein the delay is programmable via a selection of one of a delayed replica of the reference clock in accordance with a control code.

6. The subsampling phase detector of claim 1, wherein the V2I comprises a differential common-source amplifier comprising a first MOST (metal oxide semiconductor transistor) of a first type and a second MOST of the first type configured to receive the first sample and the second sample and output the first current and the second current, respectively, in accordance with a bias current controlled by the bias voltage.

7. The subsampling phase detector of claim 6, wherein the regulated current mirror comprises a third MOST of a second type and a fourth MOST of the second type sharing the same source voltage and the same gate voltage, the third MOST of the second type is configured to receive the first current, and the fourth MOST of the second type is configured to output the third current.

8. The subsampling phase detector of claim 7, wherein the regulated current mirror further comprises an operational amplifier configured to output the gate voltage in accordance with a difference between the standby voltage and a midway voltage at a midway node between the first MOST of the first type and the third MOST of the second type.

9. The subsampling phase detector of claim 8, wherein the regulated current mirror further comprises a first dummy switch that is always turned on and configured to provide a conduction for the first current to reach the midway node.

10. The subsampling phase detector of claim 9, wherein the regulated current mirror further comprises a second dummy switch that is always turned on and configured to provide a conduction for the first current to further reach the third MOST of the second type after reaching the midway node.

11. A method comprising the following steps:
receiving a reference clock and an input clock comprising a first input signal and a second input;
sampling the first input signal and the second input signal into a first sample and a second sample stored on a first capacitor and a second capacitor, respectively, in accordance with the reference clock;
converting the first sample and the second sample into a first current and a second current using a voltage-to-current converter;
using a regulated current mirror configured to convert the first current into a third current in a closed-loop manner in accordance with a standby voltage at a standby node;
using a first current steering network to steer the second current into either a fourth current directed to the standby node or a fifth current directed to an output node in accordance with a pulse signal that is synchronized with the reference clock;
using a second current steering network to steer the third current into either a sixth current directed to the standby node or a seventh current directed to the output node in accordance with the pulse signal;
connecting a lowpass filter to the output node to establish an output voltage and a lowpass-filtered voltage; and
forcing the standby voltage to be equal to the lowpass-filtered voltage using a unity-gain buffer.

12. The method of claim 11, wherein: the first current steering network comprises a first switch controlled by the first logical signal and configured to steer the second current into the fourth current and a second switch controlled by the second logical signal and configured to steer the second current into the fifth current; and the second current steering network comprises a third switch controlled by the first logical signal and configured to steer the third current into the sixth current and a fourth switch controlled by the second logical signal and configured to steer the third current into the seventh current.

13. The method of claim 11, wherein the voltage-to-current converter comprises a differential common-source amplifier comprising a first MOST (metal oxide semiconductor transistor) of a first type and a second MOST of the first type configured to receive the first sample and the second sample and output the first current and the second current, respectively, in accordance with a bias current controlled by a bias voltage.

14. The method of claim 13, wherein the regulated current mirror comprises a third MOST of a second type and a fourth MOST of the second type sharing the same source voltage and the same gate voltage, the third MOST of the second type is configured to receive the first current, and the fourth MOST of the second type is configured to output the third current.

15. The method of claim 14, wherein the regulated current mirror further comprises an operational amplifier configured to output the gate voltage in accordance with a difference between the standby voltage and a midway voltage at a midway node between the first MOST of the first type and the third MOST of the second type.

16. The method of claim 15, wherein the regulated current mirror further comprises a first dummy switch that is always turned on and configured to provide a conduction for the first current to reach the midway node.

17. The method of claim 16, wherein the regulated current mirror further comprises a second dummy switch that is always turned on and configured to provide a conduction for the first current to further reach the third MOST of the second type after reaching the midway node.

18. The method of claim 11, wherein the pulse signal comprises a first logical signal and a second logical signal that is an inversion of the first logical signal.

19. The method of claim 18, wherein the pulse signal is generated by a pulse generator comprising a delay line of a delay and configured to receive the reference clock and output a third logical signal, an inverter configured to receive the reference clock and output a fourth logical signal, and an AND gate configured to receive the third logical signal and the fourth logical signal and output the second logical signal.

20. The method of claim 19, wherein the delay is programmable via a selection of one of a delayed replica of the reference clock in accordance with a control code.

* * * * *